(12) United States Patent
Ko

(10) Patent No.: US 12,040,577 B2
(45) Date of Patent: Jul. 16, 2024

(54) CONNECTOR INTEGRATED WITH PROTECTION ELEMENT

(71) Applicant: LG Energy Solution, Ltd., Seoul (KR)

(72) Inventor: Dong-Wan Ko, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 405 days.

(21) Appl. No.: 17/422,271

(22) PCT Filed: Aug. 25, 2020

(86) PCT No.: PCT/KR2020/011332
§ 371 (c)(1),
(2) Date: Jul. 12, 2021

(87) PCT Pub. No.: WO2021/049779
PCT Pub. Date: Mar. 18, 2021

(65) Prior Publication Data
US 2022/0094109 A1    Mar. 24, 2022

(30) Foreign Application Priority Data
Sep. 11, 2019 (KR) .................. 10-2019-0113060

(51) Int. Cl.
| | |
|---|---|
| H01R 13/648 | (2006.01) |
| H01R 12/71 | (2011.01) |
| H01R 13/56 | (2006.01) |
| H01R 13/6587 | (2011.01) |
| H01R 43/02 | (2006.01) |

(52) U.S. Cl.
CPC ....... *H01R 13/6485* (2013.01); *H01R 12/716* (2013.01); *H01R 13/56* (2013.01); *H01R 13/6587* (2013.01); *H01R 43/02* (2013.01)

(58) Field of Classification Search
CPC .... H01R 12/71; H01R 12/712; H01R 12/716; H01R 43/02; H01R 43/0256; H01R 13/56; H01R 13/6485; H01R 13/6587
USPC .......................................................... 439/181
See application file for complete search history.

(56) References Cited

U.S. PATENT DOCUMENTS

| | | |
|---|---|---|
| 5,256,085 A | 10/1993 | Tan et al. |
| 5,980,272 A | 11/1999 | McHugh et al. |
| 6,522,515 B1 | 2/2003 | Whitney |
| 8,408,926 B1 | 4/2013 | Chang |

(Continued)

FOREIGN PATENT DOCUMENTS

| | | |
|---|---|---|
| CN | 1086634 A | 5/1994 |
| CN | 2354270 Y | 12/1999 |

(Continued)

OTHER PUBLICATIONS

International Search Report for Application No. PCT/KR2020/011332 mailed Dec. 1, 2020, pp. 1-3.

(Continued)

*Primary Examiner* — Khiem M Nguyen
(74) *Attorney, Agent, or Firm* — Lerner David LLP

(57) ABSTRACT

A connector integrated with a protection element, which includes a connector housing; first terminals disposed in an inner space of the connector housing; second terminals configured to extend from the inside of the connector housing to the outside of the connector housing in a state of being separated from the first terminals and be soldered to the PCB; and a protection element configured to electrically connect the first terminals and the second terminals and mounted to one side of the connector housing.

10 Claims, 4 Drawing Sheets

(56) References Cited

U.S. PATENT DOCUMENTS

| | | |
|---|---|---|
| 2009/0035994 A1 | 2/2009 | Morikawa |
| 2009/0253275 A1 | 10/2009 | Tada et al. |
| 2009/0305561 A1 | 12/2009 | Yao et al. |
| 2010/0203363 A1 | 8/2010 | Kwak et al. |
| 2012/0178285 A1 | 7/2012 | Kim |
| 2014/0134879 A1 | 5/2014 | Xiao et al. |
| 2016/0359284 A1 | 12/2016 | Hsu et al. |
| 2019/0172644 A1 | 6/2019 | Shen |

FOREIGN PATENT DOCUMENTS

| | | |
|---|---|---|
| CN | 101282618 A | 10/2008 |
| CN | 101740957 A | 6/2010 |
| CN | 101867112 A | 10/2010 |
| CN | 209045815 U | 6/2019 |
| EP | 2804270 A1 | 11/2014 |
| JP | H1012776 A | 1/1998 |
| JP | H11329605 A | 11/1999 |
| JP | 2001-135427 A | 5/2001 |
| JP | 2008091164 A | 4/2008 |
| JP | 2009037913 A | 2/2009 |
| JP | 3152838 U | 8/2009 |
| JP | 2016-21330 A | 2/2016 |
| JP | 3215875 U | 4/2018 |
| KR | 20030065629 A | 8/2003 |
| KR | 20060010414 A | 2/2006 |
| KR | 100564898 B1 | 3/2006 |
| KR | 20100091116 A | 8/2010 |
| KR | 2013-0128994 A | 11/2013 |
| KR | 101383444 B1 | 4/2014 |
| TW | 2008-40152 A | 10/2008 |

OTHER PUBLICATIONS

Extended European Search Report including Written Opinion for Application No. 20863646.4 dated May 9, 2022, pp. 1-11.

CONNECTOR INTEGRATED WITH PROTECTION ELEMENT

CROSS-REFERENCE TO RELATED APPLICATIONS

The present application is a national phase entry under 35 U.S.C. § 371 of International Application No. PCT/KR2020/011332 filed Aug. 25, 2020, published in Korean, which claims priority from Korean Patent Application No. 10-2019-0113060 filed Sep. 11, 2019, all of which are incorporated herein by reference.

TECHNICAL FIELD

The present disclosure relates to a connector, and more particularly, to a connector having a protection element for protecting a circuit element from electrostatic discharge (ESD) or electrical over-stress (EOS).

BACKGROUND ART

A connector is a connection mechanism for constructing an electric circuit by connecting an electric device and a cord or connecting a cord and a cord. Generally, a connector includes a pair of female connector and male connector, which are connected to each other by a receptacle manner A plurality of female connector pins corresponding to a contact are installed at the female connector, and a plurality of male connector pins making contact with the plurality of female connector pins are installed at the male connector. For example, the male connector may be coupled to a surface of a printed circuit board (PCB) by means of SMT (Surface Mounter Technology), and the female connector may be complementarily fastened with the male connector.

Meanwhile, the PCB (Printed Circuit Board) includes various chips and components in addition to the connector that mediates the connection with a plurality of boards or other terminals. Recently, as the functions of electronic products have diversified, elements included in the PCB are also becoming more complex.

As the PCB circuit configuration becomes more complex as above, electrical interference (for example, electromagnetic interference (EMI), electrostatic discharge (ESD)) or electrical over-stress (EOS) is increasing. The electrical interference or electrical over-stress may cause a malfunction of the PCB itself, as well as function deterioration or processing speed reduction of a certain element of the PCB.

For this reason, in order to protect a specific element (for example, a battery management system (BMS) chip) from ESD or EOS, as shown in FIG. 1, a protection element 3 such as a variable resistor for preventing static electricity near the connector 1 and a TVS (Transient Voltage Suppressor) diode for preventing transient voltage is disposed on the PCB 2.

However, as described above, the circuit configuration of the PCB is becoming more complex, but the appearance of electronic products is becoming more compact, so the space on the PCB where components should be mounted is insufficient. Therefore, it is becoming an issue to secure a mounting area by reducing even one small component.

SUMMARY

Technical Problem

The present disclosure is designed to solve the problems of the related art, and therefore the present disclosure is directed to installing a protection element for preventing ESD or EOS directly to a connector in order to save a component mounting space on a PCB.

Technical Solution

In one aspect of the present disclosure, there is provided a connector mounted on a printed circuit board (PCB), comprising: a connector housing; first terminals disposed in an inner space of the connector housing; second terminals extending from the inner space of the connector housing to an outside of the connector housing, wherein the second terminals are separate from the first terminals and are soldered to the PCB; and a protection element configured to electrically connect the first terminals to the second terminals and mounted to one side of the connector housing.

The protection element may have at least one of an ESD prevention function, an EOS prevention function and an EMI prevention function.

The connector housing may include pin insertion holes formed through an upper plate thereof in a vertical direction, the protection element may include an element body and element pins extending from the center of the element body, the element body may be attached to a surface of the upper plate of the connector housing, and the element pins may come into contact with the first terminals or the second terminals through the pin insertion holes.

The element pins may include first element pins located at a first side of the element body and second element pins located at a second side of the element body, the first element pins may come into contact with the first terminals in one-to-one relationship, and the second element pins may come into contact with the second terminals in one-to-one relationship.

The element body may be bonded to the surface of the upper plate of the connector housing.

Each first terminal may include a first vertical part configured to extend vertically from a lower plate of the connector housing; and a first horizontal part configured to extend horizontally from a top end of the first vertical part.

Each first terminal may further include a concave first groove formed at an intersection between the first vertical part and the first horizontal part, and the first element pin may be fitted into the first groove.

Each second terminal may include a second horizontal part configured to extend coaxially with the first horizontal part; and a second vertical part bent from an end of the second horizontal part and connected to the PCB.

Each second terminal may further include a second concave groove formed on the second horizontal part, and the second element pin may be fitted into the second groove.

The protection element may be positioned inside the connector housing, the first terminal may be connected to a first side of the protection element, and the second terminal may be connected to a second side of the protection element.

The protection element may further include a support member configured to extend downward from a bottom end of the protection element, and the support member may be configured either to be connected to a lower plate of the connector housing or to be connected onto the PCB through the lower plate of the connector housing.

In another aspect of the present disclosure, there is also provided a battery pack, comprising the connector described in any of the embodiments herein.

Advantageous Effects

According to an embodiment of the present disclosure, it is possible to provide a connector integrated with a protection element for preventing ESD or EOS in order to save a component mounting space on a PCB.

The effect of the present disclosure is not limited to the above-described effects, and effects not mentioned herein will be clearly understood by those skilled in the art from this specification and the accompanying drawings.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In the following description, a printed circuit board (PCB) 2 may refer to a BMS circuit board 2 applied to a battery pack for a vehicle. Here, the BMS circuit board is a component of the battery pack for controlling charge and discharge of battery cells and cell balancing.

A connector according to the present disclosure may be used to transmit voltage information of secondary battery cells to a BMS chip. Here, the scope of the present disclosure is not limited to this use. That is, the connector according to the present disclosure may also be used to connect various signal transmission cables to electrical tools such as laptops, tablet PCs and smart phones.

Figure 1:
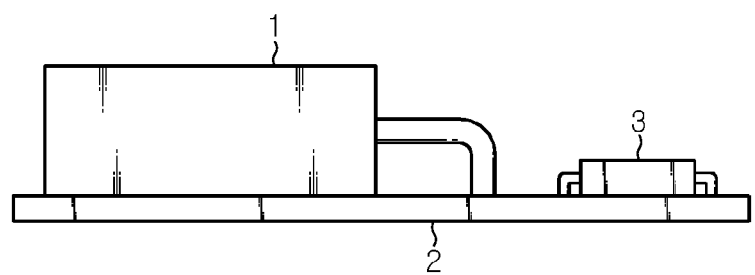
FIG. 1 is a diagram schematically showing a connector and a protection element on a conventional PCB.
Figure 2:
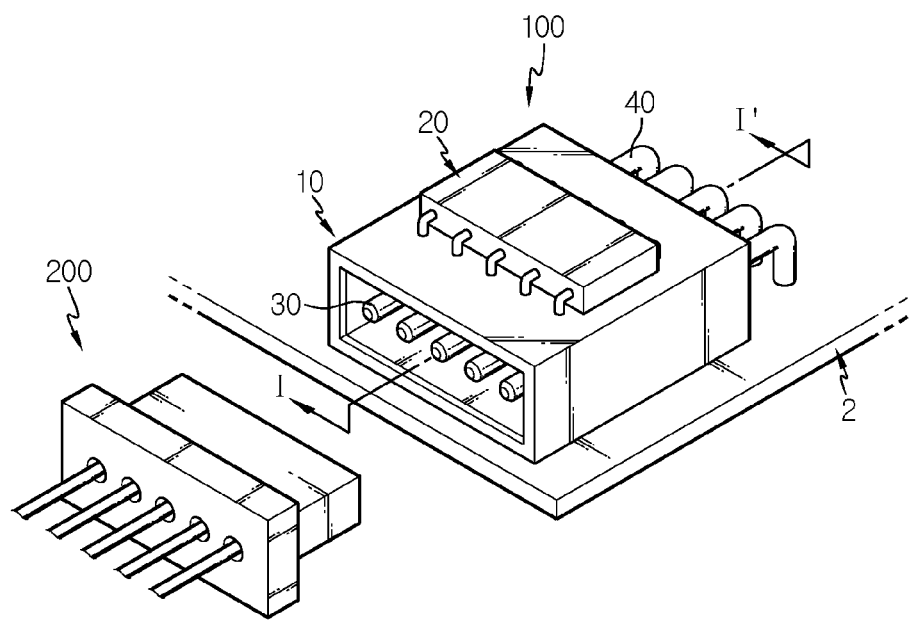
FIG. 2 is a schematic perspective view showing a connector according to an embodiment of the present disclosure.
Figure 3:
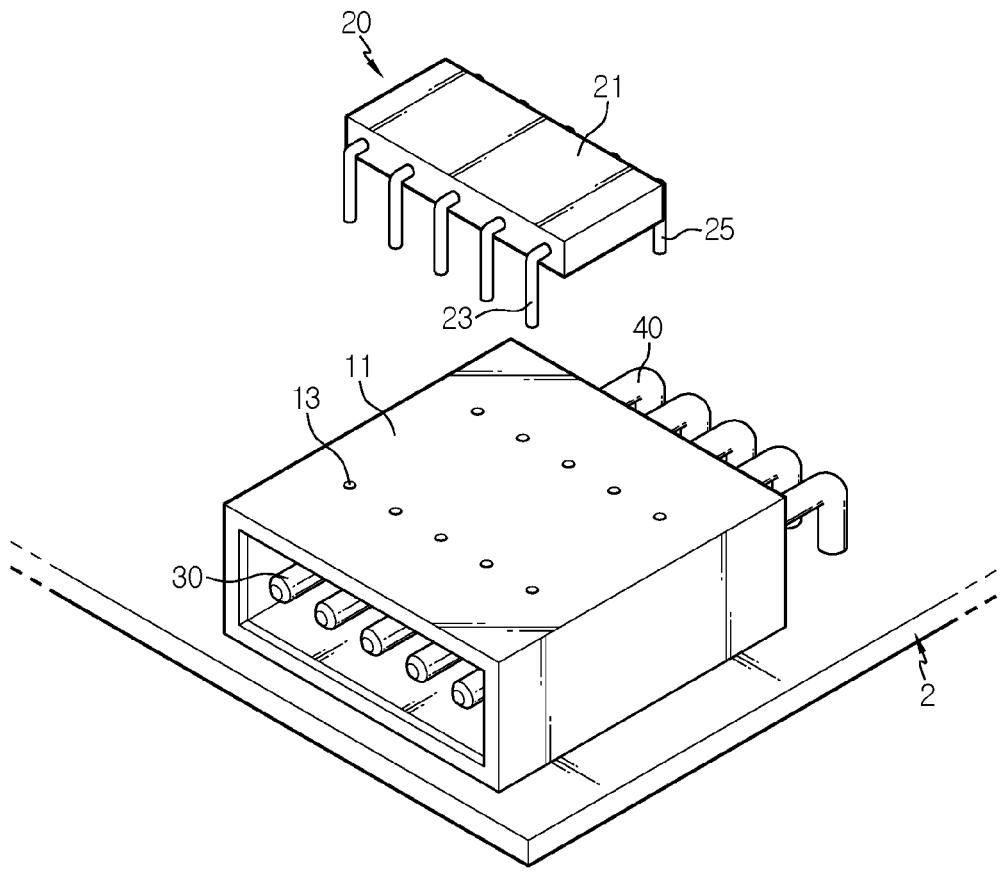
FIG. 3 is a partially exploded perspective view showing the connector of FIG. 2.
Figure 4:
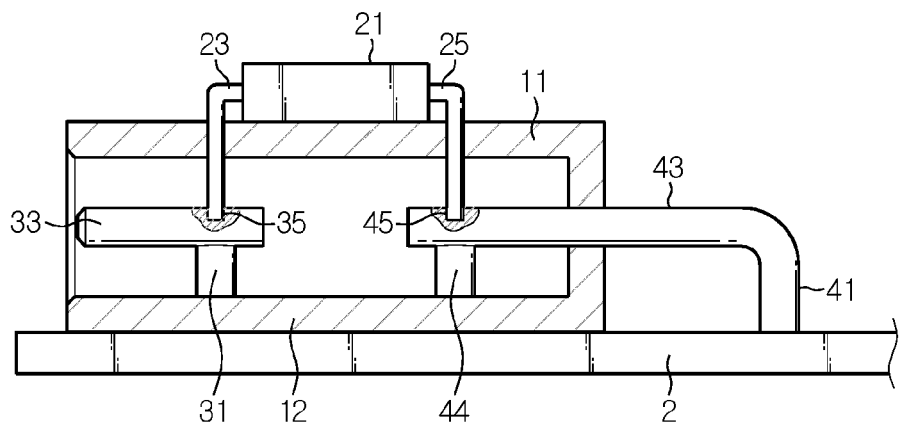
FIG. 4 is a sectional view, taken along the line I-I' of FIG. 2.

FIG. 2 is a schematic perspective view showing a connector according to an embodiment of the present disclosure, FIG. 3 is a partially exploded perspective view showing the connector of FIG. 2, and FIG. 4 is a sectional view, taken along the line I-I' of FIG. 2.

Referring to these figures, a connector 100 according to an embodiment of the present disclosure includes a connector housing 10, first terminals 30 disposed in an inner space of the connector housing 10, second terminals 40 extending from the inside of the connector housing 10 to the outside of the connector housing 10 in a state of being separated from the first terminals 30 and soldered to the PCB 2, and a protection element 20 configured to electrically connect the first terminals 30 and the second terminals 40 and mounted to one side of the connector housing 10.

As shown in FIG. 2, the connector 100 may be disposed at an edge region of one side of the PCB 2, and may be connected to and disconnected from a cable connector 200 in a plug-in manner Although not shown in detail for convenience of drawing, the second terminals 40 of connector 100 are soldered to conductor patterns on the PCB 2, and the conductor patterns may be connected to a BMS chip, such as an application-specific integrated circuit (ASIC).

The connector housing 10 is a structure to protect the first and second terminals 40 from external shock and to stably connect and fix the cable connector 200, which is a counterpart. The connector housing 10 is made of a plastic material with insulating properties, for example, by injection molding.

The connector housing 10 includes an upper plate 11 provided flat so that the protection element 20 may be placed straight thereon. As another example, it is also possible that an intaglio is formed at the surface of the upper plate 11 of the connector housing 10 according to the shape of a bottom surface of the protection element 20 so that the protection element 20 is placed in the intaglio portion to reinforce the fixability. In addition, pin insertion holes 13 may be further provided in the upper plate 11 of the connector housing 10. The pin insertion holes 13 are formed through the upper plate 11 of the connector housing 10 in the upper and lower direction, and element pins of the protection elements 20 may inserted into the connector housing 10 through the pin insertion holes 13.

The protection element 20 is an electrical component capable of preventing malfunction and damage of other elements around the connector 100, and may have at least one of an ESD prevention function, an EOS prevention function and an EMI prevention function. For example, the protection element 20 may employ a variable resistor having an ESD prevention function, a TVS (Transient Voltage Suppressor) diode having an EOS prevention function, or the like.

Referring to FIGS. 3 and 4, the protection element 20 includes an element body 21 and element pins.

The element body 21 may be implemented in the form of a cuboid-shaped chip, and may be attached to the surface of the upper plate 11 of the connector housing 10. Preferably, the element body 21 is bonded to the surface of the upper plate 11 of the connector housing 10 using an adhesive so that the protection element 20 is not easily separated from the connector housing 10 even by vibration or impact.

The element pins include first element pins 23 located at a left side of the element body 21 and second element pins 25 located at a right side of the element body 21. The first element pins 23 and the second element pins 25 may be provided in the number corresponding to the first terminals 30 and the second terminals 40 employed in the connector housing 10, respectively.

In particular, in the connector 100 according to this embodiment, the terminals are divided into the first terminals 30 and the second terminals 40, unlike the conventional connector 100. That is, the terminals are divided into two parts, namely the first terminals 30 and the second terminals 40, and they are electrically connected only through the protection element 20.

For example, in the protection element 20, the element body 21 is placed on the upper plate 11 of the connector housing 10, and the first and second element pins 25 are inserted into the connector housing 10 through the pin insertion holes 13. The inserted first element pins 23 are in contact with the first terminals 30 in one-to-one relationship, and the second element pins 25 are in contact with the second terminals 40 in one-to-one relationship.

Therefore, when the cable connector 200 serving as a counterpart is plugged into the connector 100 according to this embodiment, a current flows in the order of the first terminal 30, the protection element 20 and the second terminal 40, so it is possible to block an unexpected surge, ESD or EOS at the connector 100 itself.

Referring to FIG. 4 again, the first terminal 30 according to this embodiment may correspond to a front end of the existing terminal, and the second terminal 40 may correspond to a rear end of the existing terminal. The second terminal 40 may pass through connector housing 10, be bent at the outside, and then be fixed onto the conductor pattern of the PCB 2 by soldering.

Since the first terminal 30 is disconnected from the second terminal 40, a structure for support the first terminal 30 at a certain height is required. To this end, in the connector 100 of the present disclosure, the first terminal 30 is configured to include a first vertical part 31 extending vertically from the lower plate 12 of the connector housing 10 and a first horizontal part 33 extending horizontally from a top end of the first vertical part 31.

In addition, the first terminal 30 may further include a first groove 35 formed concavely at a spot where the first vertical part 31 intersects with the first horizontal part 33. The first groove 35 may be useful for fitting an end of the first element pin 23.

Also, the second terminal 40 is configured to include a second horizontal part 43 extending horizontally on a coaxial line with the first horizontal part 33, and a second vertical part 41 bent at one end of the second horizontal part 43 and connected to the PCB 2.

Similar to the first terminal 30, the second terminal 40 may further include a second groove 45 formed concavely at one side of the second horizontal part 43. Similar to the first groove 35, the second groove 45 may be useful to fit an end of the second element pin 25.

The first groove 35 is formed at the spot where the first vertical part 31 intersects with the first horizontal part 33, so that the first element pin 23 of the protection element 20 is inserted vertically into the first terminal 30 to prevent that the first terminal 30 from being twisted or inclined. For the same purpose as the first groove 35, the second groove 45 is formed at the second horizontal part 43, and a reinforcing part 44 for supporting the second horizontal part 43 may be further provided below the second groove 45.

If the connector 100 integrated with the protection element 20 according to an embodiment of the present disclosure is used, it is possible to save space for the protection element 20, which has been mounted around the connector 100 in the existing technique, and also to block external electric shock applied from the outside at the connector 100 itself.

Figure 5:
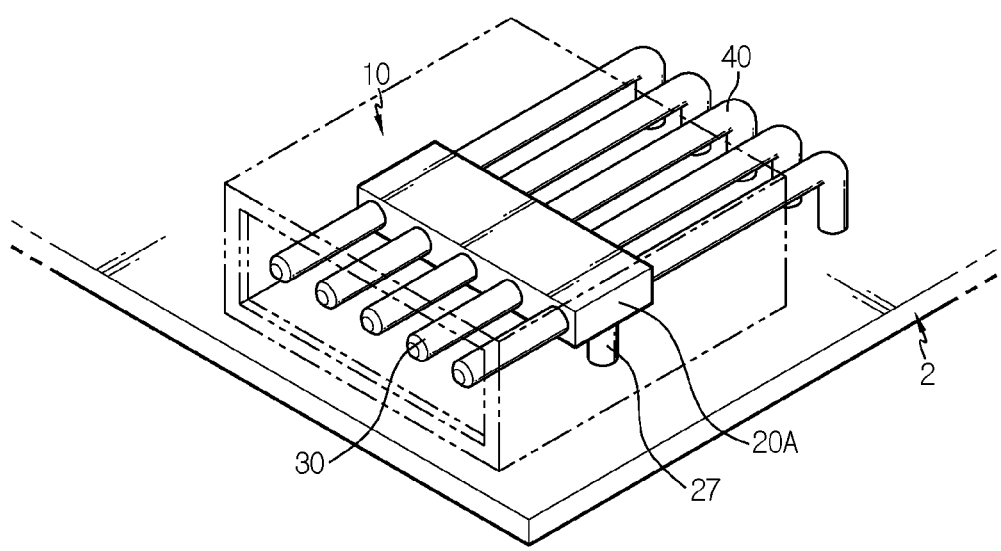
FIG. 5 is a schematic perspective view showing a connector according to another embodiment of the present disclosure.

FIG. 5 is a schematic perspective view showing a connector according to another embodiment of the present disclosure.

Next, another embodiment of the present disclosure will be briefly described with reference to the FIG. 5. The same reference signs as those in the former embodiment denote the same components, and only features different from the former embodiment will be described in detail, without describing the same components again.

In the connector 100 according to the former embodiment, the protection element 20 is provided at the outside of the connector housing 10. However, in the connector 100 according to this embodiment, a protection element 20A is provided to be included in the connector housing 10.

In addition, the protection element 20A of the connector 100 according to this embodiment has no element pin, and is configured such that the first terminals 30 and the second terminals 40 are directly connected to the protection element 20A.

In this case, since the first terminal 30 may be connected to the second terminal 40 via the protection element 20A, the first vertical part 31 may be omitted. Instead, the structural stability may be secured by providing a support member 27 that extends downward from a bottom end of the protection element 20A and connected to the lower plate 12 of the connector housing 10 or connected onto the PCB 2 through the lower plate 12 of the connector housing 10. The support member 27 serves to support the protection element 20A at a certain height inside the connector housing 10. The support member 27 may be utilized as a ground line, if necessary.

In the connector 100 according to this embodiment as described above, since the protection element 20A is entirely located inside the connector housing 10, there is no issue such as breakage of the element pins or removal of the protection element 20 even though vibration or external impact is applied.

Meanwhile, a battery pack according to the present disclosure may be configured to include the connector 100 described above. The connector 100 may be installed at a BMS circuit board 2 of the battery pack. The BMS circuit board 2 is an electrical component of the battery pack to control charging/discharging and cell balancing of battery cells.

In addition to the connector 100, the BMS circuit board 2 and the battery cells, the battery pack may further include a cooling device for managing the temperature of the battery cells, a control device such as a fuse and a relay and for controlling the flow of current, a pack case for packaging the components, or the like.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, even though the terms expressing directions such as "upper", "lower", "left" and "right" are used in the specification, they are just for convenience of description and can be expressed differently depending on the location of a viewer or a subject, as apparent to those skilled in the art.

What is claimed is:

1. A connector mounted on a printed circuit board (PCB), comprising:
a connector housing including a plurality of pin insertion holes formed in a first surface of the connector housing;
first terminals disposed in an inner space of the connector housing;
second terminals extending from the inner space of the connector housing to an outside of the connector housing, wherein the second terminals are separate from the first terminals and are soldered to the PCB; and
a protection element configured to electrically connect the first terminals to the second terminals when mounted to the first surface of the connector housing, the protection element including a plurality of pins adapted to contact the first terminals and the second terminals when inserted through the pin insertion holes.

2. The connector according to claim 1,
wherein the protection element has at least one of an electrostatic discharge (ESD) prevention function, an electrical over-stress (EOS) prevention function or an electromagnetic interference (EMI) prevention function.

3. The connector according to claim 1,
wherein the first surface is an upper plate of the connector housing,
the pin insertion holes are formed through the upper plate of the connector housing in a vertical direction, and
the protection element includes an element body, and the plurality of pins extend from the element body.

4. The connector according to claim 3,
wherein the plurality of pins include first element pins located at a first side of the element body and second element pins located at a second side of the element body, and
the first element pins come into contact with the first terminals in one-to-one relationship and the second element pins come into contact with the second terminals in one-to-one relationship.

5. The connector according to claim 3,
wherein the element body is bonded to the surface of the upper plate of the connector housing.

6. The connector according to claim 4,
wherein each first terminal includes:
a first vertical part configured to extend vertically from a lower plate of the connector housing; and
a first horizontal part configured to extend horizontally from a top end of the first vertical part.

7. The connector according to claim 6,
wherein each first terminal further includes a concave first groove formed at an intersection between the first vertical part and the first horizontal part, and
the first element pin is fitted into the first groove.

8. The connector according to claim 7,
wherein each second terminal includes:
a second horizontal part configured to extend coaxially with the first horizontal part; and
a second vertical part bent from an end of the second horizontal part and connected to the PCB.

9. The connector according to claim 8,
wherein each second terminal further includes a concave second groove formed on the second horizontal part, and
the second element pin is fitted into the second groove.

10. A battery pack, comprising the connector according to claim 1.

* * * * *